United States Patent
Oi et al.

(10) Patent No.: US 9,997,450 B2
(45) Date of Patent: Jun. 12, 2018

(54) WIRING SUBSTRATE AND SEMICONDUCTOR DEVICE

(71) Applicant: SHINKO ELECTRIC INDUSTRIES CO., LTD., Nagano-shi, Nagano-ken (JP)

(72) Inventors: Kiyoshi Oi, Nagano (JP); Tomotake Minemura, Nagano (JP)

(73) Assignee: Shinko Electric Industries Co., Ltd. (JP)

( * ) Notice: Subject to any disclaimer, the term of this patent is extended or adjusted under 35 U.S.C. 154(b) by 0 days. days.

(21) Appl. No.: 15/284,592

(22) Filed: Oct. 4, 2016

(65) Prior Publication Data

US 2017/0103942 A1    Apr. 13, 2017

(30) Foreign Application Priority Data

Oct. 9, 2015  (JP) .................................. 2015-201143

(51) Int. Cl.
*H01L 23/498* (2006.01)
*H01L 23/31* (2006.01)
*H01L 23/00* (2006.01)

(52) U.S. Cl.
CPC .... *H01L 23/49866* (2013.01); *H01L 23/3157* (2013.01); *H01L 23/49827* (2013.01); *H01L 23/49838* (2013.01); *H01L 24/09* (2013.01); *H01L 24/13* (2013.01); *H01L 24/17* (2013.01); *H01L 2224/0401* (2013.01); *H01L 2224/81193* (2013.01)

(58) Field of Classification Search
CPC ......... H01L 23/49866; H01L 23/49838; H01L 23/3157
See application file for complete search history.

(56) References Cited

U.S. PATENT DOCUMENTS

2008/0211098 A1* 9/2008 Suzuki ................ H01L 21/2885
                                                    257/751
2010/0132998 A1* 6/2010 Lee .................... H01L 23/49816
                                                    174/267

(Continued)

FOREIGN PATENT DOCUMENTS

JP        2010-129996 A    6/2010
JP        2014-225632 A    4/2014

*Primary Examiner* — Mark Tornow
*Assistant Examiner* — Abbigale Boyle
(74) *Attorney, Agent, or Firm* — Tarolli, Sundheim, Covell & Tummino LLP

(57) ABSTRACT

A wiring substrate includes a first connection terminal and a protective insulation layer. The first connection terminal is electrically connected to a wiring layer by a via wiring and projects upward from an upper surface of an insulation layer. The protective insulation layer is located on the upper surface of the insulation layer to contact and cover a portion of a side surface of the first connection terminal. The first connection terminal includes a lower portion that is continuous with the via wiring and an upper portion that is continuous with the lower portion. The lower portion is smaller in crystal grain size than the upper portion. The lower portion and the upper portion are formed from the same metal material. The side surface of the lower portion has a higher roughness degree than the side surface of the upper portion.

8 Claims, 9 Drawing Sheets

(56) References Cited

U.S. PATENT DOCUMENTS

| | | | |
|---|---|---|---|
| 2013/0043583 A1* | 2/2013 | Wu | H01L 23/3171 257/737 |
| 2014/0202746 A1* | 7/2014 | Anderson | H01L 21/76847 174/255 |
| 2015/0054174 A1* | 2/2015 | Lo | H01L 23/53214 257/774 |
| 2015/0061115 A1* | 3/2015 | Chen | H01L 24/13 257/737 |

* cited by examiner

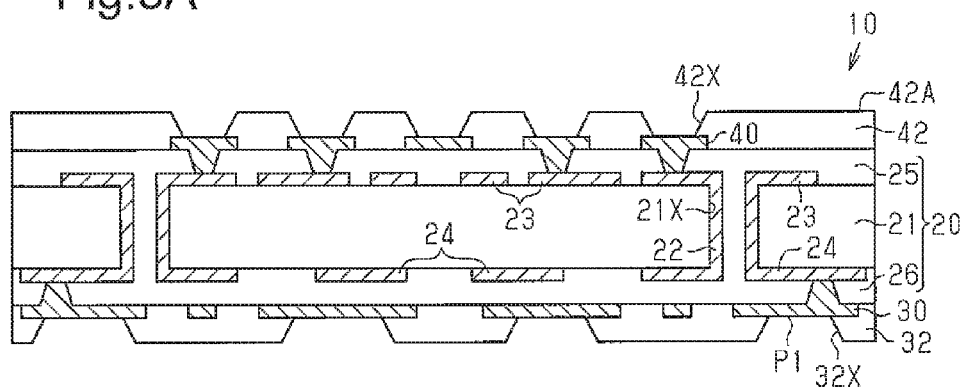
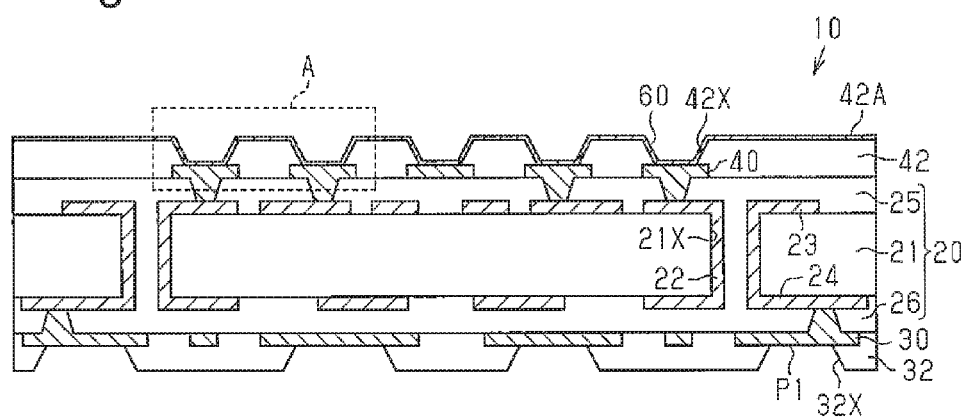
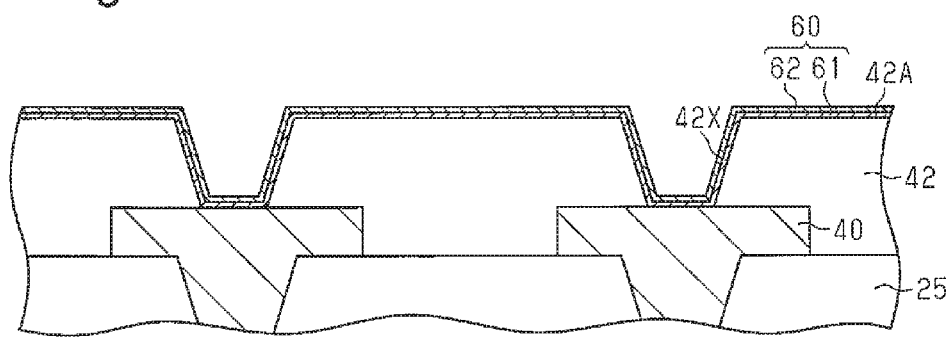

WIRING SUBSTRATE AND SEMICONDUCTOR DEVICE

CROSS-REFERENCE TO RELATED APPLICATIONS

This application is based upon and claims the benefit of priority from prior Japanese Patent Application No. 2015-201143, filed on Oct. 9, 2015, the entire contents of which are incorporated herein by reference.

FIELD

This disclosure relates to a wiring substrate, a semiconductor device, and a method for manufacturing a wiring substrate.

BACKGROUND

Wiring substrates that are used to mount electronic components such as semiconductor chips have various shapes and various structures. Semiconductor chips have become highly integrated and highly sophisticated. This has increased the demand for finer wirings formed in a wiring substrate on which a semiconductor chip is mounted. In a prior art wiring substrate, to form finer wiring, a wiring pattern and an insulation layer are formed on a base substrate, and columnar connection terminals are located on the wiring pattern that is exposed from the insulation layer. Japanese Laid-Open Patent Publication Nos. 2014-225632 and 2010-129996 each describe the structure of such a wiring substrate.

In the above wiring substrate, the insulation layer and the connection terminals have different thermal expansion coefficients. Thus, when a reliability test is performed on the wiring substrate through a heating cycle, thermal stress is generated by the difference in thermal expansion coefficient between the insulation layer and the connection terminals. The thermal stress concentrates on the interface between the insulation layer and each connection terminal. Thus, cracks or the like are easily formed at the interface between the insulation layer and the connection terminal.

SUMMARY

One embodiment of a wiring substrate includes a wiring layer, an insulation layer that covers the wiring layer, a via hole that extends through the insulation layer in a thickness-wise direction and exposes an upper surface of the wiring layer, a via wiring formed in the via hole, a columnar first connection terminal electrically connected to the wiring layer by the via wiring and adapted to be connected to an electronic component, and a protective insulation layer formed on the upper surface of the insulation layer. The first connection terminal projects upward from an upper surface of the insulation layer. The protective insulation layer is in contact with and covers a portion of a side surface of the first connection terminal. The first connection terminal includes a lower portion that is continuous with the via wiring and an upper portion that is continuous with the lower portion. The lower portion is set to be smaller in crystal grain size than the upper portion. The lower portion and the upper portion are formed from the same metal material. A side surface of the lower portion is set to have a higher roughness degree than a side surface of the upper portion.

Other embodiments and advantages of this disclosure will become apparent from the following description, taken in conjunction with the accompanying drawings, illustrating by way of example the principles of this disclosure.

It is to be understood that both the foregoing general description and the following detailed description are exemplary and explanatory and are not restrictive of the invention, as claimed.

BRIEF DESCRIPTION OF THE DRAWINGS

The embodiments, together with objects and advantages thereof, may best be understood by reference to the following description of the presently preferred embodiments together with the accompanying drawings in which:

FIGS. 3A to 3C, 4A, 4B, 5A, 5B, 6A to 6C, 7A, and 7B are schematic cross-sectional diagrams illustrating a method for manufacturing the wiring substrate of FIG. 1A;

DESCRIPTION OF THE EMBODIMENTS

Figure 1A:
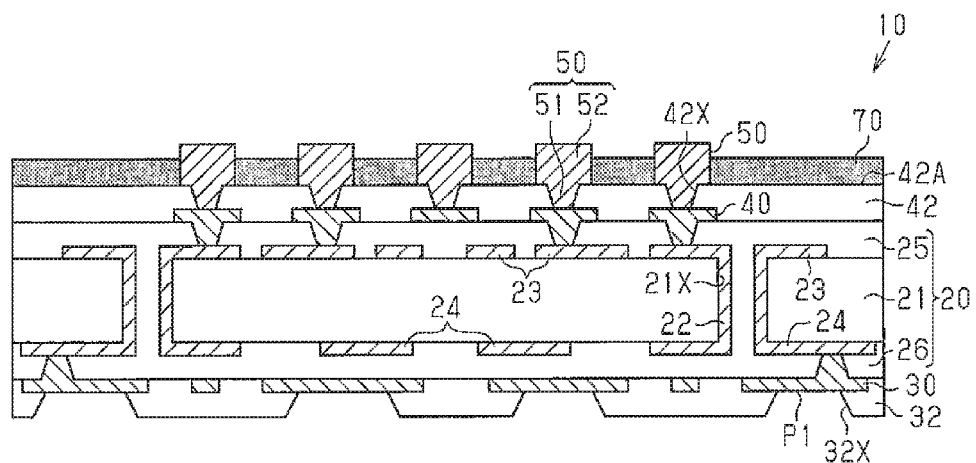
FIG. 1A is a schematic cross-sectional view illustrating one embodiment of a wiring substrate.

Each embodiment will now be described with reference to the accompany drawings. Elements in the drawings may be partially enlarged for simplicity and clarity and thus have not necessarily been drawn to scale. To facilitate understanding, hatching lines may not be illustrated or be replaced by shadings in the cross-sectional drawings.

The structure of a wiring substrate 10 will now be described.

As illustrated in FIG. 1A, the wiring substrate 10 includes a substrate body 20, which is located at a position proximate to the middle in a thickness-wise direction of the wiring substrate 10. The substrate body 20 includes a core substrate 21, through electrodes 22, and wiring patterns 23, 24. The through electrodes 22 are located in through holes 21X, which extend through the core substrate 21 in the thickness-wise direction. The core substrate 21 includes an upper surface on which the wiring pattern 23 is formed. The core substrate 21 includes a lower surface on which the wiring pattern 24 is formed. The through electrodes 22 electrically connect the wiring patterns 23, 24. The substrate body 20 also includes an insulation layer 25, which is formed on the upper surface of the core substrate 21 and covers the wiring pattern 23, and an insulation layer 26, which is formed on the lower surface of the core substrate 21 and covers the wiring pattern 24.

The material of the core substrate 21 may be a glass-epoxy resin formed, for example, by impregnating a glass cloth (glass woven cloth), which functions as a reinforcement material, with a thermosetting insulative resin including an epoxy resin as the main component and curing the resin. The reinforcement material is not limited to a glass cloth and may be, for example, a glass non-woven cloth, an aramid woven cloth, an aramid non-woven cloth, a liquid crystal polymer (LCP) woven cloth, or an LCP non-woven cloth. The thermosetting insulative resin is not limited to an epoxy resin and may be, for example, a resin material such as a polyimide resin or a cyanate resin. The material of the through electrodes 22 and the wiring patterns 23, 24 may be, for example, copper (Cu) or a copper alloy. The material of the insulation layers 25, 26 may be, for example, an insulative resin such as an epoxy resin or a polyimide resin or a resin material formed by mixing the insulative resin and a filler such as silica or alumina.

The insulation layer 26 includes a lower surface on which a wiring layer 30 is formed. The wiring layer 30 includes via wirings, which extend through the insulation layer 26 in the thickness-wise direction, and a wiring pattern, which is electrically connected to the wiring pattern 24 by the via wirings and formed on the lower surface of the insulation layer 26.

A solder resist layer 32 is formed on the lower surface of the insulation layer 26 and covers a portion of the wiring layer 30. The material of the solder resist layer 32 may be, for example, an insulative resin such as an epoxy resin or an acryl resin. The solder resist layer 32 includes openings 32X, which expose portions of the lower surface of the wiring layer 30 as external connection pads P1. The external connection pads P1 may be connected to external connection terminals 96 (refer to FIG. 2A) such as lead pins or solder balls. The external connection terminals 96 are used to mount the wiring substrate 10 on a mount substrate such as a motherboard.

As necessary, a surface-processed layer may be formed on the wiring layer 30 (external connection pads P1) that is exposed in the openings 32X. Examples of the surface-processed layer include a gold (Au) layer, a nickel (Ni) layer/Au layer (metal layer in which Ni layer and Au layer are sequentially formed), and an Ni layer/palladium (Pd) layer/Au layer (metal layer in which Ni layer, Pd layer, and Au layer are sequentially formed). The Au layer, the Ni layer, and the Pd layer may each be, for example, an electroless plating metal layer formed through electroless plating. The Au layer is a metal layer formed from Au or an Au alloy. The Ni layer is a metal layer formed from Ni or an Ni alloy. The Pd layer is a metal layer formed from Pd or a Pd alloy. Also, the surface-processed layer may be formed on surfaces of the external connection pads P1 through an anti-oxidization process such as an organic solderability preservative (OSP) process. For example, when the OSP process is performed, an organic coating of an azole compound, an imidazole compound, or the like is formed on the surfaces of the external connection pads P1 as the surface-processed layer. The wiring layer 30 that is exposed in the openings 32X may be used external connection terminals. Alternatively, the surface-processed layer formed on the wiring layer 30 may be used as an external connection terminal.

The insulation layer 25 includes an upper surface on which the wiring layer 40 is formed. The wiring layer 40 includes via wirings, which extend through the insulation layer 25 in the thickness-wise direction, and a wiring pattern, which is electrically connected to the wiring pattern 23 by the via wirings and formed on the upper surface of the insulation layer 25.

An insulation layer 42 is formed on the upper surface of the insulation layer 25 and covers the wiring layer 40. The material of the insulation layer 42 may be, for example, an insulative resin including a photosensitive resin such as a phenol resin or a polyimide resin as the main component. The insulation layer 42 may include, for example, a filler such as silica or alumina. However, the material of the insulation layer 42 is not limited to an insulative resin including a photosensitive resin as the main component and may be, for example, the same insulative resin used as the material of the insulation layers 25, 26.

Via holes 42X extend through predetermined portions of the insulation layer 42 in the thickness-wise direction and expose portions of an upper surface of the wiring layer 40. Each via hole 42X is tapered so that the diameter decreases from an upper side toward a lower side (toward core substrate 21) in FIG. 1A. Each via hole 42X has the form of, for example, an inverted truncated cone in which the upper open end has a larger diameter than the lower open end.

The insulation layer 42 includes an upper surface 42A on which a wiring layer 50 is formed. The wiring layer 50 includes via wirings 51, which are located in the via holes 42X, and connection terminals 52, which project upward from the upper surface 42A of the insulation layer 42. Each connection terminal 52 is, for example, a columnar connection terminal (metal post) that extends upward from the upper surface 42A of the insulation layer 42. Each connection terminal 52 is, for example, cylindrical. The connection terminals 52 function as electronic component mount pads that are electrically connected to an electronic component. In the present example, the electronic component is a semiconductor chip 90 (refer to FIG. 2A). For example, a solder layer 92 is bonded to an upper surface of each connection terminal 52 and electrically connected to a connection terminal 91 (refer to FIG. 2A) of the semiconductor chip 90.

The via wirings 51 are formed, for example, integrally with the respective connection terminals 52. The material of the via wirings 51 and the connection terminals 52 may be, for example, copper or a copper alloy.

A protective insulation layer 70 is formed on the upper surface 42A of the insulation layer 42 and covers side surfaces of the connection terminals 52. The protective insulation layer 70 is in contact with, for example, a portion of the side surface of each connection terminal 52 and covers the portion of the side surface of the connection terminal 52. Additionally, the protective insulation layer 70 covers, for example, the entire upper surface 42A of the insulation layer 42 located at the outer side of the connection terminals 52. In the present example, the protective insulation layer 70 is set to be thinner than the connection terminals 52. Thus, the upper surface of each connection terminal 52 and an upper portion of the side surface of each connection terminal 52 are exposed from the protective insulation layer 70.

The protective insulation layer 70 may have, for example, the same material as the insulation layer 42, that is, an insulative resin including a photosensitive resin such as a phenol resin or a polyimide resin as the main component. However, the material of the protective insulation layer 70 does not have to be the same as the material of the insulation layer 42 and may be, for example, the same as the material of the solder resist layer 32.

Figure 1B:
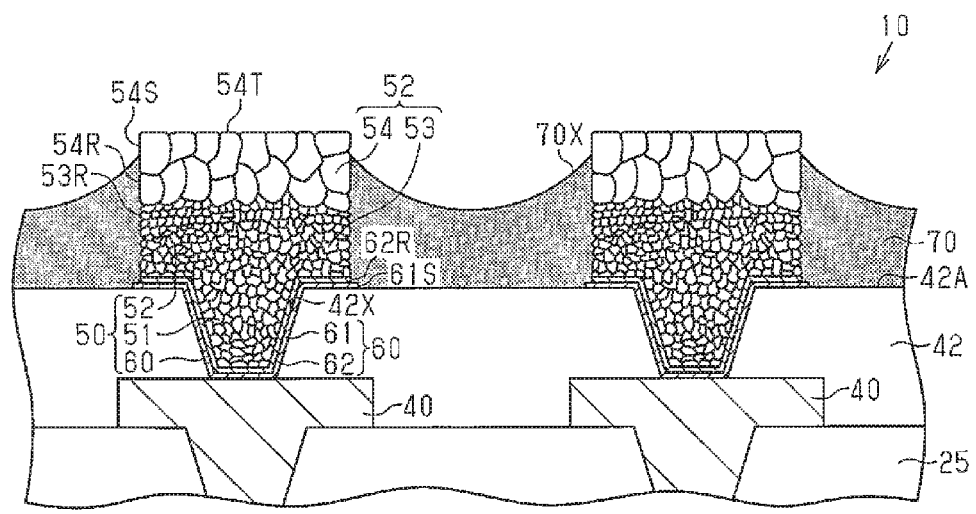
FIG. 1B is a partially enlarged cross-sectional view of the wiring substrate illustrated in FIG. 1A.

The structure of each of the wiring layer 50 and the protective insulation layer 70 will now be described with reference to FIG. 1B.

The wiring layer 50 includes a seed layer 60. The seed layer 60 continuously covers the upper surface of the wiring layer 40 that is exposed in each via hole 42X, an inner surface of the insulation layer 42 that defines the via hole 42X, and the upper surface 42A of the insulation layer 42. In the present example, the seed layer 60 has a two-layer structure in which a metal film 61 and a metal film 62 are sequentially formed. The metal film 61 continuously covers the upper surface of the wiring layer 40, the inner surface of the insulation layer 42, and the upper surface 42A of the insulation layer 42. The metal film 62 covers the upper surface of the metal film 61. In the present example, the side surface of the metal film 61 projects outward from the side surface of the connection terminal 52 and the side surface of the metal film 62. That is, the contour of the metal film 61 is set to be larger than the contour of the connection terminal 52 and the counter of the metal film 62 in a plan view.

The metal films 61, 62 may each be, for example, a metal film (sputtered film) formed through sputtering. The metal film 61 functions as a metal barrier film that limits diffusion of Cu, for example, from the metal film 62 or the via wirings 51 (e.g., Cu layer) to the insulation layer 42. The material of the metal film 61 is preferably a metal having a higher adhesiveness to the insulation layer 42 than a metal (e.g., Cu) forming the metal film 62. Also, the material of the metal film 61 is preferably a metal having a higher corrosion resistance than the metal (e.g., Cu) forming the metal film 62. Such a material of the metal film 61 may be, for example, titanium (Ti), titanium nitride (TiN), tantalum nitride (TaN), tantalum (Ta), or chromium (Cr). The material of the metal film 62 may be, for example, copper or a copper alloy. The thickness of the metal film 61 may be, for example, approximately 20 to 50 nm. The thickness of the metal film 62 may be, for example, approximately 100 to 300 nm.

Each via wiring 51 is formed on the metal film 62. For example, the via hole 42X is filled with the via wiring 51 formed on the seed layer 60. Although the seed layer 60 and the via wiring 51 have been separately described, the seed layer 60 and the via wiring 51, which are formed in the via hole 42X, may be together referred to as the via wiring 51.

Each connection terminal 52 is formed on an upper surface of the seed layer 60, which is located on the upper surface 42A of the insulation layer 42, and an upper surface of the via wiring 51. The connection terminal 52 includes a lower portion 53, which is continuous with the via wiring 51, and an upper portion 54, which is continuous with the lower portion 53. That is, the upper portion 54 is formed on the lower portion 53 in the thickness-wise direction. A crystal grain forming the lower portion 53 has a crystal grain size that differs from that of a crystal grain forming the upper portion 54. In the present example, the lower portion 53, which is located at a side of the connection terminal 52 proximate to the wiring layer 40, is smaller in crystal grain size than the upper portion 54, which is located at a side of the connection terminal 52 that is bonded to the solder layer 92 (refer to FIG. 2B). The lower portion 53 and the upper portion 54 are formed from the same material, for example, copper.

The average crystal grain size of Cu crystal grains in the lower portion 53 may be set to a range that is, for example, 0.5 μm or greater and less than 0.9 μm. The average crystal grain size of Cu crystal grains in the upper portion 54 may be set to a range that is, for example, 1 μm or greater and less than 3 μm. The lower portion 53 having small crystal grains is set to be, for example, thicker than the upper portion 54 having large crystal grains. Thus, the lower portion 53 having a larger thickness improves the adhesiveness between the connection terminal 52 and the protective insulation layer 70. The thickness of the lower portion 53 may be, for example, approximately 6 to 8 μm. The thickness of the upper portion 54 may be, for example, approximately 2 to 3 μm.

Although the seed layer 60 and the connection terminal 52 have been separately described, a portion of the seed layer 60 that is formed on the upper surface 42A of the insulation layer 42 and the connection terminal 52 may be together referred to as the connection terminal 52.

In the present example, a portion of the side surface of each connection terminal 52 is rough. In the present example, the entire side surface of the lower portion 53 of the connection terminal 52 defines a rough surface 53R. A part of the side surface of the upper portion 54 of the connection terminal 52 defines a rough surface 54R. In the present example, a lower part of side surface of upper portion 54 located close to lower portion 53 defines the rough surface 54R. The lower part of the side surface of the upper portion 54 defining the rough surface 54R is covered by the protective insulation layer 70. The side surface of the metal film 62 defines a rough surface 62R. An upper part of the side surface of the upper portion 54 that is exposed from the protective insulation layer 70, that is, the remaining part of the side surface of the upper portion 54 that excludes the lower part of the side surface of the upper portion 54, defines a smooth surface 54S that has a lower roughness degree than the rough surfaces 53R, 54R. Also, in the same manner as the smooth surface 54S, the upper surface of the connection terminal 52 (upper portion 54) defines a smooth surface 54T. Additionally, the entire side surface of the metal film 61 defines a smooth surface 61S that has a lower roughness degree than the rough surfaces 53R, 54R.

From the viewpoint of the adhesiveness to the protective insulation layer 70, the rough surfaces 62R, 53R, 54R are set to have a higher roughness degree than the smooth surfaces 54S, 54T and the upper surface of the wiring layer 40. However, the rough surface 54R is set to have a lower roughness degree than the rough surface 53R. The roughness degree of the rough surfaces 62R, 53R may have a surface roughness Rz value of, for example, approximately 3000 to 4000 nm. The roughness degree of the rough surface 54R may have a surface roughness Rz value of, for example, approximately 2000 to 2800 nm. The roughness degree of the smooth surfaces 54S, 54T may have a surface roughness Rz value of, for example, approximately 500 to 1000 nm. The surface roughness Rz value is a value that indicates surface roughness and is based on the ten-point average roughness standard. Specifically, the surface roughness Rz value is obtained by selecting a portion of a roughness curve that corresponds to a reference length in a direction in which the average line extends and adding an average of absolute values of the five highest peaks and an average of absolute values of the five lowest valleys that are measured from the selected portion of the average line.

The protective insulation layer 70 is in contact with and covers the entire side surface (entire surface of smooth surface 61S) of the metal film 61, the entire side surface (entire surface of rough surface 62R) of the metal film 62, the entire side surface (entire surface of rough surface 53R) of the lower portion 53 of each connection terminal 52, and the entire lower part of the side surface (entire surface of rough surface 54R) of the upper portion 54. The protective insulation layer 70 exposes the smooth surface 54S (i.e., upper part of side surface of upper portion 54) and the smooth surface 54T (i.e., upper surface of upper portion 54) of each connection terminal 52. Additionally, the upper surface of the protective insulation layer 70 between adjacent ones of the connection terminals 52 is recessed toward the insulation layer 42 to define a recess 70X that is arcuate in a cross sectional view.

Figure 2A:
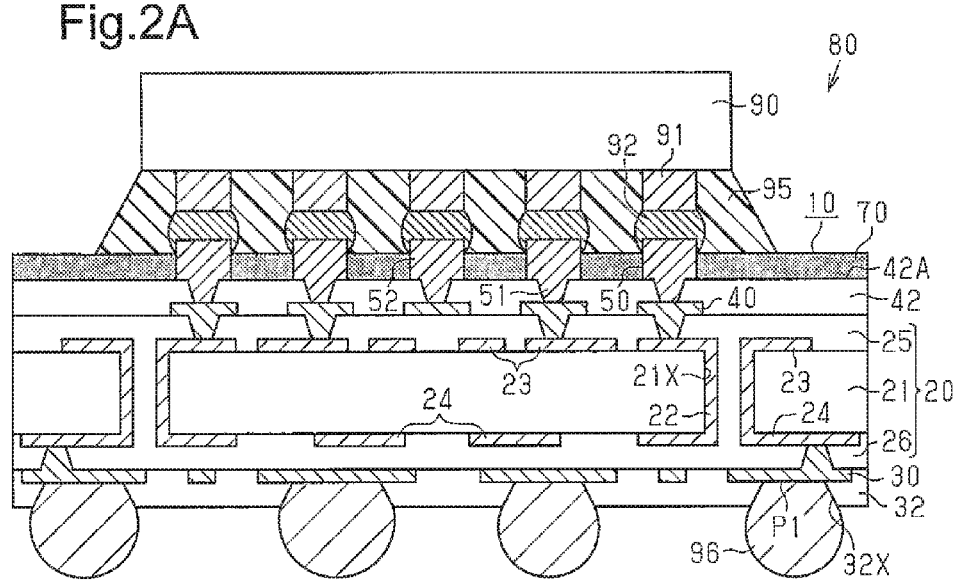
FIG. 2A is a schematic cross-sectional view of a semiconductor device that includes the wiring substrate of FIG. 1A.
Figure 2B:
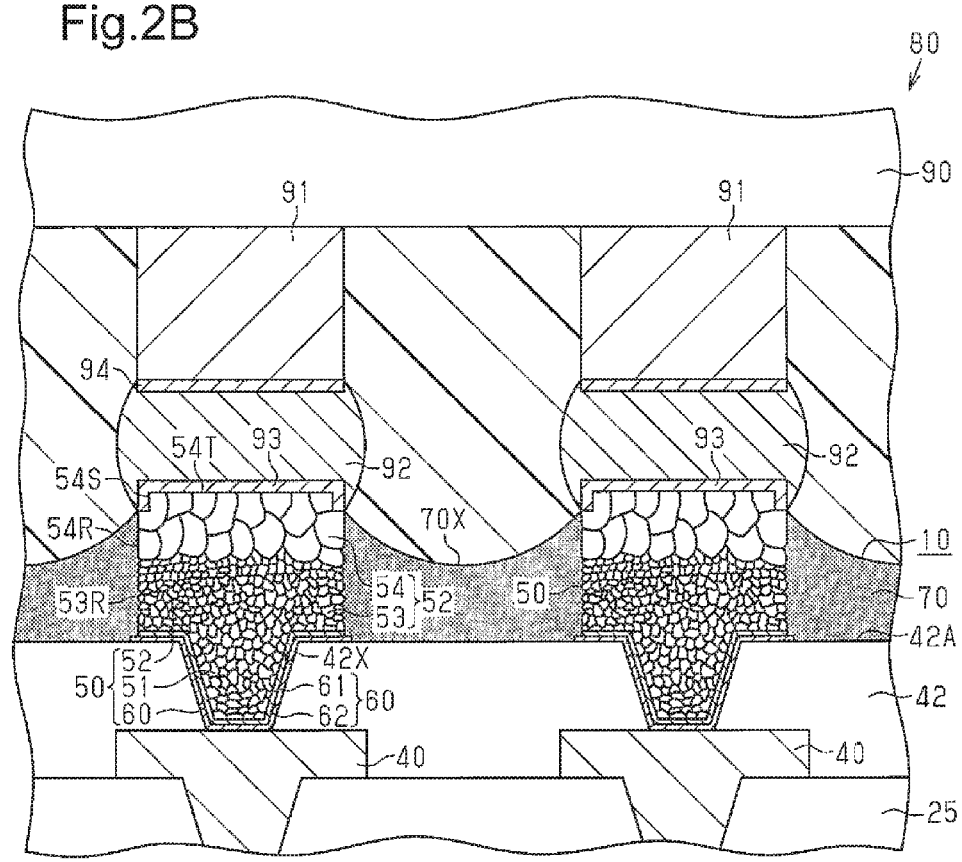
FIG. 2B is a partially enlarged cross-sectional view of the semiconductor device illustrated in FIG. 2A.

The structure of a semiconductor device 80 will now be described with reference to FIGS. 2A and 2B. As illustrated in FIG. 2A, the semiconductor device 80 includes the wiring substrate 10, one or more (here, one) of the semiconductor chips 90, an underfill resin 95, and the external connection terminals 96.

The semiconductor chip 90 is flip-chip-mounted on the wiring substrate 10. The semiconductor chip 90 includes a circuit formation surface (here, lower surface) on which the connection terminals 91 are arranged. When the connection terminals 91 are boned to the connection terminals 52 of the wiring substrate 10 by the solder layer 92, the connection terminals 91 and the solder layer 92 electrically connect the semiconductor chip 90 and the wiring layer 50.

The semiconductor chip 90 may be, for example, a logic chip such as a central processing unit (CPU) chip or a graphics processing unit (GPU) chip. Also, the semiconductor chip 90 may be, for example, a memory chip such as a dynamic random access memory (DRAM) chip, a static random access memory (SRAM) chip, or a flash memory chip. Further, a number of semiconductor chips 90 having the combination of the logic chips and the memory chips may be mounted on the wiring substrate 10.

The connection terminals 91 may each be, for example, a metal post. Each connection terminal 91 is columnar and extends downward from the circuit formation surface of the semiconductor chip 90. In the present example, the connection terminals 91 are, for example, cylindrical. The material of the connection terminals 91 may be, for example, copper or a copper alloy. The connection terminals 91 may each be, for example, a metal bump, such as a gold bump, instead of a metal post.

The solder layer 92 is bonded to both of the connection terminals 52, 91. The solder layer 92 may each be, for example, a plating of a Pb-free solder. The Pb-free solder may be, for example, an Sn-Silver(Ag)-based Pb-free solder, an Sn—Cu-based Pb-free solder, an Sn—Ag—Cu-based Pb-free solder, or an Sn—Bi-based Pb-free solder. In the present embodiment, the solder layer 92 is a plating of an Sn—Ag-based Pb-free solder.

The underfill resin 95 fills a gap formed between the wiring substrate 10 and the semiconductor chip 90. The material of the underfill resin 95 may be, for example, an insulative resin such as an epoxy resin.

The external connection terminals 96 are formed on the external connection pads P1 of the wiring substrate 10. The external connection terminals 96 are, for example, electrically connected to pads arranged on a mount substrate such as a motherboard (not illustrated). The external connection terminals 96 may each be, for example, a solder ball or a lead pin. In the present embodiment, the external connection terminals 96 are each a solder ball.

The bonding structure of the connection terminals 52, the solder layer 92, and the connection terminals 91 will now be described with reference to FIG. 2B.

The solder layer 92 is directly bonded to the connection terminals 52. In other words, in the wiring substrate 10, the surface (part of side surface and entire upper surface) of each connection terminal 52 that is exposed from the protective insulation layer 70 is free from a surface-processed layer. That is, the upper part (i.e., smooth surface 54S) of side surface of the upper portion 54 and the entire upper surface (i.e., smooth surface 54T) of the upper portion 54 of each connection terminal 52, which are both exposed from the protective insulation layer 70 and define an outermost surface (here, uppermost surface) of the wiring substrate 10, are directly bonded to the solder layer 92. In this manner, the solder layer 92 is directly bonded to the upper portion 54 of the connection terminal 52, that is, the smooth surface 54T (entire upper surface) and the smooth surface 54S (upper part of side surface) of the upper portion 54 having relatively large crystal grains.

The direct bonding of the connection terminal 52 (upper portion 54) and the solder layer 92 forms an Sn—Cu alloy layer 93 at the interface between the solder layer 92 and each of the smooth surfaces 54S, 54T of the upper portion 54. That is, the alloy layer 93 is formed in a portion that bonds the connection terminal 52 and the solder layer 92. In other words, the alloy layer 93 practically bonds the connection terminal 52 and the solder layer 92 in a direct manner. The alloy layer 93 covers, for example, the entire upper surface of the connection terminal 52 and a portion of the side surface (upper part of side surface of upper portion 54) of the connection terminal 52.

Also, an Sn—Cu alloy layer 94 is formed at the interface between the connection terminal 91 and the solder layer 92.

The operation of the wiring substrate 10 and the semiconductor device 80 will now be described.

The wiring substrate 10 includes the protective insulation layer 70, which is located on the upper surface 42A of the insulation layer 42 and in contact with and covers a portion of the side surface of each columnar connection terminal 52. Thus, the lower surface (here, lower surface of seed layer 60) of the connection terminal 52 is in contact with the upper surface 42A of the insulation layer 42. Also, a portion of the side surface of the connection terminal 52 is in contact with the protective insulation layer 70. Thus, the area of the interface between the connection terminal 52 and each insulation layer (insulation layer 42 and the protective insulation layer 70) is increased as compared to when the protective insulation layer 70 is not formed. This allows for dispersion of the thermal stress, which is formed by the different thermal expansion coefficients between the connection terminal 52 and the insulation layer (photosensitive resin layer), and limits local concentration of the stress. Hence, when the reliability test is performed through a heating cycle, formation of cracks at the interface between each connection terminal 52 and each insulation layer (insulation layer 42 and protective insulation layer 70) is limited.

The side surface of each connection terminal 52 is rough at a portion that is in contact with the protective insulation layer 70. In the present example, the side surface of the lower portion 53 of the connection terminal 52 defines the rough surface 53R, and the lower part of the side surface of the upper portion 54 of the connection terminal 52 defines the rough surface 54R. This produces an anchor effect and improves the adhesiveness between each connection terminal 52 and the protective insulation layer 70. That is, the adhesiveness between the connection terminal 52 and the protective insulation layer 70 is improved as compared to when the entire side surface of each connection terminal 52 is smooth. This limits separation of the protective insulation layer 70 from the insulation layer 42.

The side surface (rough surface 53R) of the lower portion 53 is set to have a high roughness degree. This further improves the adhesiveness between the connection terminal 52 and the protective insulation layer 70. The surfaces (rough surface 54R and smooth surfaces 54S, 54T) of the upper portion 54 is set to have a lower roughness degree than the rough surface 53R. This ensures flatness of the surface of the portion (i.e., upper portion 54) of the connection terminal 52 that is bonded to the solder layer 92. Consequently, the connection terminals 91 of the semiconductor chip 90 are accurately flip-chip-bonded to the connection terminals 52. This achieves accurate mounting of the semiconductor chip 90. As described above, in the semiconductor device 80, the lower portion 53 and the upper portion 54 of the connection terminal 52 have different surface roughness degrees. Thus, the connection terminal 52 has improved adhesiveness between the connection terminal 52 and the protective insulation layer 70 and improved flatness of the pad portion of the connection terminal 52.

When a semiconductor device that is obtained by bonding a metal layer (Cu layer) having small crystal grains like the lower portion 53 and a solder layer containing Sn is kept at a high temperature, a number of Kirkendall voids are formed at the interface between the Cu layer and the solder layer due to the difference in diffusion speeds between Cu and Sn. This occurs because the difference between the diffusion speed of Cu toward Sn and the diffusion speed of Sn toward Cu increases when a metal layer that is boned to a solder layer has small crystal grains and many grain boundaries. In this regard, in the present embodiment, the upper portion 54, which is bonded to the solder layer 92, is set to have larger crystal grains than the lower portion 53. This reduces the difference between the diffusion speed of Cu toward Sn and the diffusion speed of Sn toward Cu and limits formation of Kirkendall voids at the interface between the upper portion 54 and the solder layer 92.

In the present embodiment, to limit formation of Kirkendall voids, the average crystal grain size of Cu crystal grains in the upper portion 54 is set to a range that is, for example, 1 µm or greater and less than 3 µm. The inventors of the present application verified through experiments that formation of Kirkendall voids at the interface between the upper portion 54 and the solder layer 92 was effectively limited by setting the average crystal grain size of Cu crystal grains in the upper portion 54 to the range from 1 to 3 µm. Also, the inventors of the present application verified through the experiments that Kirkendall voids were formed at the interface between the upper portion 54 and the solder layer 92 when the average crystal grain size of Cu crystal grains in the upper portion 54 was less than 1 µm.

The inventors of the present application verified that when the average crystal grain size of Cu crystal grains in the upper portion 54 was 0.84 µm and the semiconductor device 80 was kept under a high temperature environment of 150° C. for a thousand hours, Kirkendall voids were formed at the interface between the upper portion 54 and the solder layer 92 based on the experiment results. However, the inventors of the present application verified that when the average crystal grain size of Cu crystal grains in the upper portion 54 was 1.45 µm, Kirkendall voids were not formed at the interface between the upper portion 54 and the solder layer 92 even when the semiconductor device 80 was kept under a high temperature environment of 150° C. for a thousand hours. Also, the inventors of the present application verified that when the average crystal grain size of Cu crystal grains in the upper portion 54 was 2.58 µm, Kirkendall voids were not formed at the interface between the upper portion 54 and the solder layer 92.

As clarified by the experiment results, formation of Kirkendall voids at the interface between the upper portion 54 and the solder layer 92 is appropriately limited by setting the average crystal grain size of Cu crystal grains in the upper portion 54 to 1 µm or greater (preferably, 1.45 µm or greater). Setting of the average crystal grain size of Cu crystal grains in the upper portion 54 to 3 µm or greater takes time to form the upper portion 54 and increases manufacturing costs.

A method for manufacturing the wiring substrate 10 will now be described.

In the step of FIG. 3A, the wiring substrate 10 is manufactured prior to a step in which the wiring layer 50 and the protective insulation layer 70 are formed. The wiring substrate 10 may be manufactured through a known manufacturing process, which will be briefly described with reference to FIG. 3A.

The through holes 21X are first formed in predetermined portions of the core substrate 21. The inner surfaces of the core substrate 21 defining the through holes 21X undergo plating to form the through electrodes 22. The wiring patterns 23, 24 are formed, for example, through a subtractive process. Then, each of the upper surface and the lower surface of the core substrate 21 is laminated with a resin film in a vacuum atmosphere. The resin films are heated and cured to form the insulation layers 25, 26. Alternatively, the insulation layers 25, 26 may be formed by applying a resin in a paste or liquid state and heating the resin. Openings are formed in the insulation layers 25, 26 and undergo a desmear process as necessary. Then, for example, a semi-additive process is performed to form the wiring layers 30, 40. The solder resist layer 32, which includes the openings 32X that expose portions of the wiring layer 30 as the external connection pads P1, is formed on the lower surface of the insulation layer 26. Also, the insulation layer 42, which includes the via holes 42X that expose portions of the upper surface of the wiring layer 40, is formed on the upper surface of the insulation layer 25.

In the step of FIG. 3B, the seed layer 60 is formed to continuously cover the upper surface 42A of the insulation layer 42, the inner surfaces of the insulation layer 42 defining the via holes 42X, and the upper surface of the wiring layer 40 that is exposed in the via holes 42X. The seed layer 60 may be formed, for example, through sputtering or electroless plating. In the present example, the seed layer 60 is formed through sputtering.

In this case, as illustrated in FIG. 3C, titanium is deposited through sputtering on the entire inner surfaces of the insulation layer 42 defining the via holes 42X, the entire upper surface 42A of the insulation layer 42, and the entire upper surface of the wiring layer 40 that is exposed in the via holes 42X to form the metal film 61 (Ti layer). Then, copper is deposited through sputtering on the metal film 61 to form the metal film 62 (Cu layer). This forms the seed layer 60 having a two-layer structure (Ti layer/Cu layer). FIG. 3C is an enlarged cross-sectional view of section A (refer to frame of broken line) of the wiring substrate 10 illustrated in FIG. 3B.

Figure 4A:
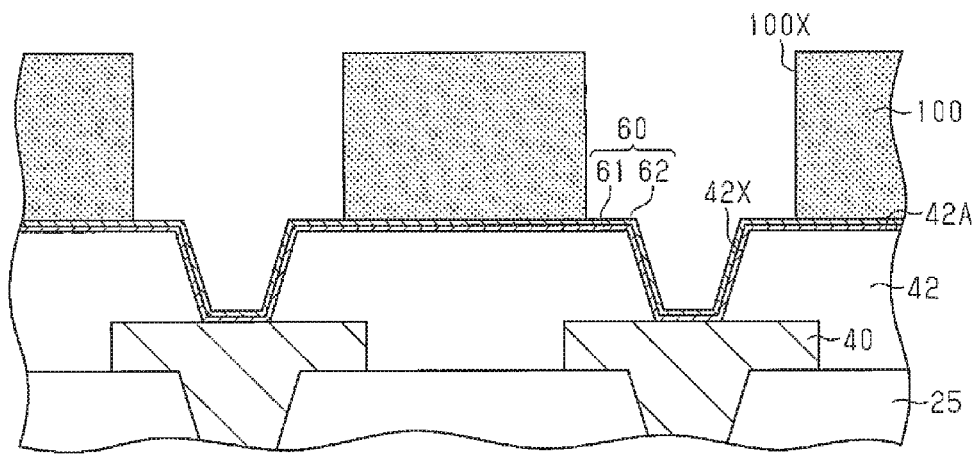

In the step of FIG. 4A, a resist layer 100 is formed on the seed layer 60, which is formed on the upper surface 42A of the insulation layer 42. The resist layer 100 includes opening patterns 100X at predetermined positions. The opening patterns 100X expose portions of the seed layer 60 that correspond to regions in which the wiring layer 50 (refer to FIG. 1A) is formed. The resist layer 100 may be formed from a material that has, for example, resistance to plating of the next step. The material of the resist layer 100 may be, for example, a photosensitive dry film resist or a liquid photoresist. For example, a resist material such as a novolac resin or an acryl resin may be used. For example, when a photosensitive dry film resist is used, the upper surface of the metal film 62 is laminated with the dry film through thermo-compression bonding. The dry film is patterned through photolithography to form the resist layer 100 that includes the opening patterns 100X. The resist layer 100 may be formed through the same steps when a liquid photoresist is used.

Figure 4B:
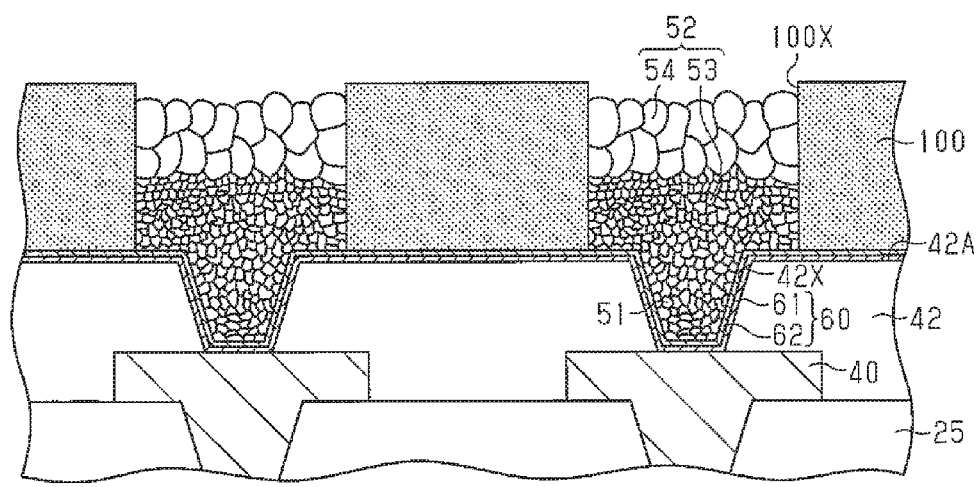

In the step of FIG. 4B, electrolytic plating in which the resist layer 100 is used as a plating mask and the seed layer 60 is used as a plating power feeding layer is performed to form the via wirings 51 and the connection terminals 52 on the upper surface of the seed layer 60. The structural body illustrated in FIG. 4A is, for example, immersed in an electrolyte copper plating solution and undergoes electrolyte copper plating with the current density set to be high (e.g., approximately 3.5 to 5 A/dm$^2$). This forms the via wirings 51 and the lower portions 53 of the connection terminals 52 on the seed layer 60 that is exposed from the opening patterns 100X of the resist layer 100. That is, the via holes 42X, which are located inward from the seed layer 60, are filled with the via wirings (electrolyte copper plating films). Additionally, the lower portions 53 (electrolyte copper plating films) of the columnar connection terminals 52 are formed on the via wirings 51. Subsequently, the structural body including the via wirings 51 and the lower portions 53 is kept immersed in the electrolyte copper plating solution, and the electrolyte copper plating is performed with the current density set to be lower (e.g., approximately 1 to 2 A/dm$^2$) than when the lower portions 53 were formed. This forms the upper portions 54 (electrolyte copper plating films) of the connection terminals 52 on the lower portions 53. In electrolytic plating, a higher current density generally increases the formation speed of a plating film and reduces the crystal grain size of the plating film. Thus, as illustrated in FIG. 4B, the crystal grain size of the via wirings 51 and the lower portions 53 differs from the crystal grain size of the upper portions 54. When the lower portions 53 and the upper portions 54 are formed using different current densities, the connection terminals 52 have different crystal grain sizes between the lower portions 53 and the upper portions 54. In the present example, the lower portions 53, which are formed through electrolytic plating with the current density set to a relatively high first value, have smaller crystal grains than the upper portions 54, which are formed through electrolytic plating with the current density set to a second value that is lower than the first value. When the lower portions 53 are formed through electrolyte copper plating with the current density set to approximately 3.5 to 5 A/dm$^2$, the average crystal grain size of Cu crystal grains in the lower portions 53 is in a range that is 0.5 μm or greater and less than 0.9 μm. Also, when the upper portions 54 are formed through electrolyte copper plating with the current density set to approximately 1 to 2 A/dm$^2$, the average crystal grain size of Cu crystal grains in the upper portions 54 is in a range that is 1 μm or greater and less than 3 μm.

In the present example, the crystal grain sizes of the lower portions 53 and the upper portions 54 are adjusted by the current density. Instead, the crystal grain sizes of the lower portions 53 and the upper portions 54 may be adjusted by an electrolytic plating condition other than the current density (e.g., composition or temperature of plating solution). In any case, in the step of FIG. 4B, the electrolytic plating condition is adjusted so that the upper portions 54 have larger crystal grains than the lower portions 53. In the present example, the electrolytic plating condition is adjusted so that the average crystal grain size of the lower portions 53 is 0.5 μm or greater and less than 0.9 μm and so that the average crystal grain size of the upper portions 54 is 1 μm or greater and less than 3 μm.

Figure 5A:
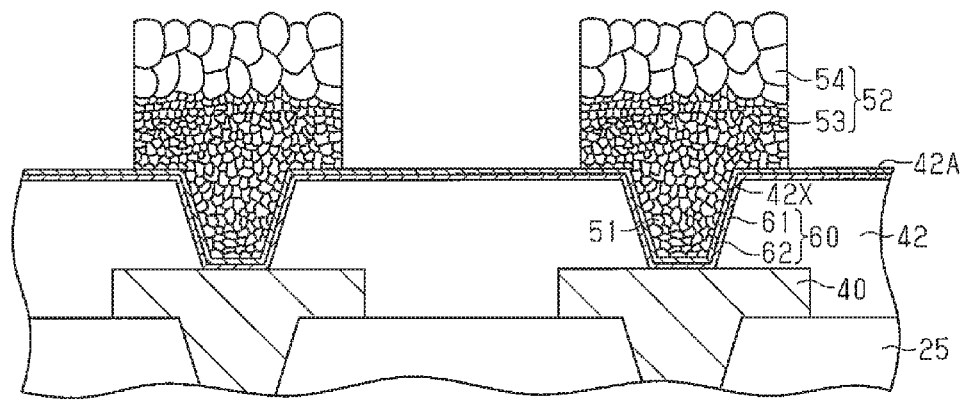
Figure 5B:
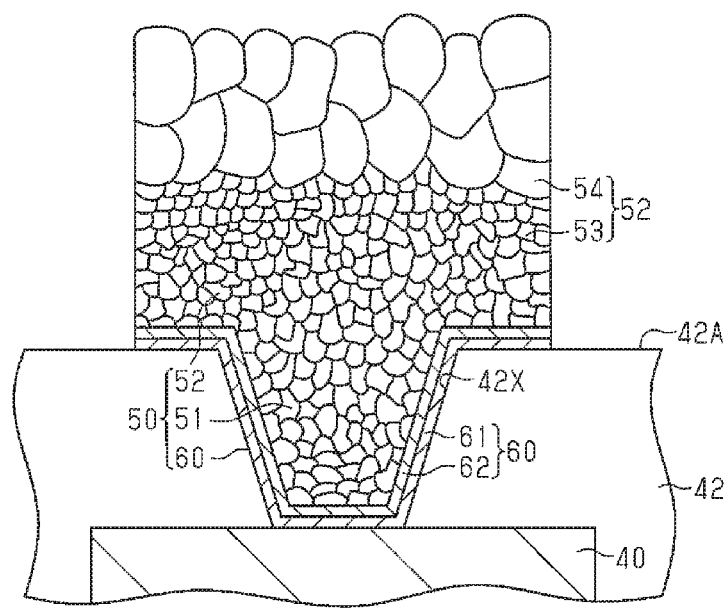

In the step of FIG. 5A, the resist layer 100 illustrated in FIG. 4B is removed, for example, by an alkaline remover. In the step of FIG. 5B, unnecessary portions of the seed layer 60 are removed through etching with the connection terminals 52 used as an etching mask. This forms the seed layer 60 and the via wiring 51 in each via hole 42X and the connection terminal 52 on the via wiring 51 and the seed layer 60 that is located on the insulation layer 42. Thus, the wiring layer 50 includes the seed layer 60, the via wiring 51, and the connection terminal 52. The upper portion 54 of the connection terminal 52 has a thickness (approximately 2 to 4 μm) set so that etching of the seed layer 60 does not eliminate the upper portion 54.

Figure 6A:
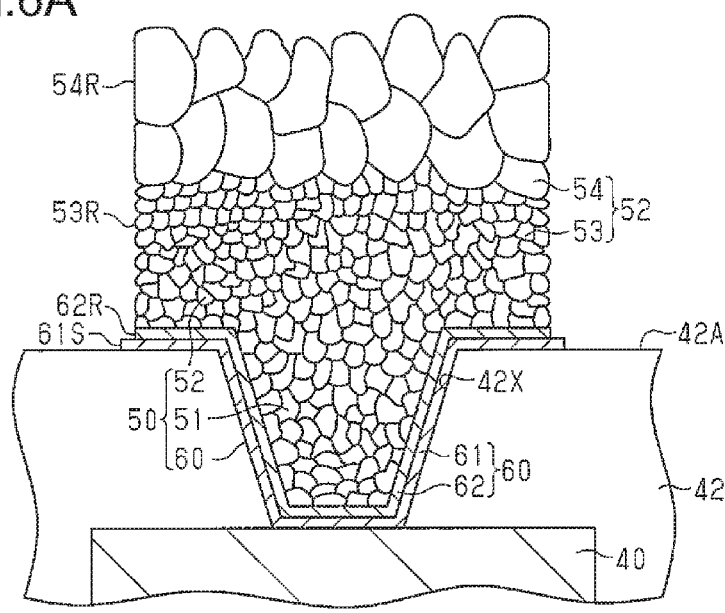

In the step of FIG. 6A, portions of the wiring layer 50 that project upward from the insulation layer 42, that is, the connection terminals 52 and the seed layer 60, are roughened. In the present example, the Cu layers (connection terminals 52 and metal film 62) of the wiring layer 50 are selectively roughened. The roughening process forms small irregularities in the side surface of the metal film 62 defining the rough surface 62R. The roughening process also forms small irregularities in the upper surface and the side surface of each connection terminal 52. In the present example, the side surface of the lower portion 53 defines the rough surface 53R, and the upper surface and the side surface of the upper portion 54 defines the rough surface 54R. The roughening process is performed so that the rough surface R53 (side surface of lower portion 53) has a higher roughness degree than the rough surface 54R (upper surface and side surface of upper portion 54). In this manner, the roughening process is performed so that the surfaces of the metal film 62 and the connection terminal 52 has a higher roughness degree than the surface (i.e., smooth surface 61S) of the metal film 61 and so that the surface of the lower portion 53 has a higher roughness degree than the surface of the upper portion 54.

The roughening process in the step of FIG. 6A may be performed, for example, through a CZ process. In the CZ process, for example, a solution containing formic acid as the main component is sprayed onto a Cu surface to etch Cu and form a rough surface. In the CZ process, chemical polishing (micro-etching) is selectively performed on Cu. Additionally, the CZ process gives priority to dissolution of Cu grain boundaries. This forms etched portions along the Cu grain boundaries. Thus, as illustrated in FIG. 6A, when the CZ process is performed, grain boundary grooves among Cu crystal grains become deeper than those prior to the CS process (refer to FIG. 5B). When such a CZ process is performed, portions having more Cu grain boundaries have a higher roughness degree. Thus, when the connection terminal 52 undergoes the CZ process, the surface roughness degree of the lower portion 53, which has small Cu crystal grains (i.e., more Cu grain boundaries), is higher than the surface roughness degree of the upper portion 54, which has large Cu crystal grains (i.e., less Cu grain boundaries). Therefore, when the CS process is performed on the lower portion 53 and the upper portion 54 under the same condition, the rough surface 53R of the lower portion 53 has a higher roughness degree than the rough surface 54R of the upper portion 54. Prior to the roughening process, the surface roughness degree of the connection terminal 52 and the metal film 62 has, for example, a surface roughness Rz value of approximately 1000 to 2000 nm. The roughening process is performed so that the roughness degree of the rough surfaces 62R, 53R has a surface roughness Rz value of approximately 3000 to 4000 nm and so that the roughness degree of the rough surface 54R has a surface roughness Rz value of approximately 2000 to 2800 nm.

Thus, the rough surface 54R of the upper portion 54 has a lower roughness degree than the rough surface 53R of the lower portion 53. This limits reduction in size of the contour of the upper portion 54 thereby limiting increases in the electrical resistance of the upper portion 54 that would result from the roughening process.

The roughening process may be performed through a neo-brown process, which gives priority to dissolution of Cu grain boundaries in the same manner as the CZ process. In the neo-brown process, a Cu surface is etched by being immersed in or sprayed with a hydrogen peroxide-based/hydrogen sulfide-based solution to form a rough surface.

Additionally, the outer edge of the metal film 61 may project outward from the side surfaces of the connection terminal 52 and the metal film 62 through the roughening process. That is, the contour of the metal film 61 may be larger than the contours of the connection terminal 52 and the metal film 62 in a plan view.

Figure 6B:
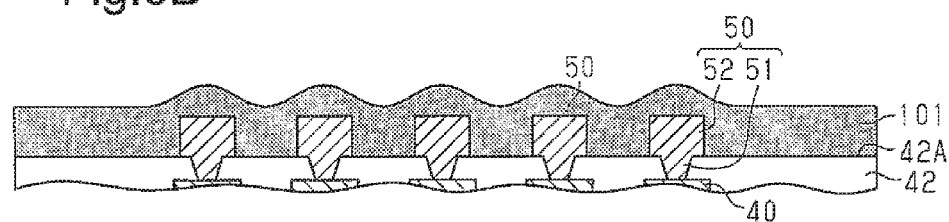

In the step of FIG. 6B, a photosensitive resin layer 101 is formed on the upper surface 42A of the insulation layer 42 and covers the entire surfaces (side surface and upper surface) of each connection terminal 52. The photosensitive resin layer 101 may be formed, for example, by applying a varnish of a photosensitive resin through spin coating. In the present embodiment, the material of the photosensitive resin layer 101 is a positive photosensitive resin. However, a negative photosensitive resin may be used as the material of the photosensitive resin layer 101.

Figure 6C:
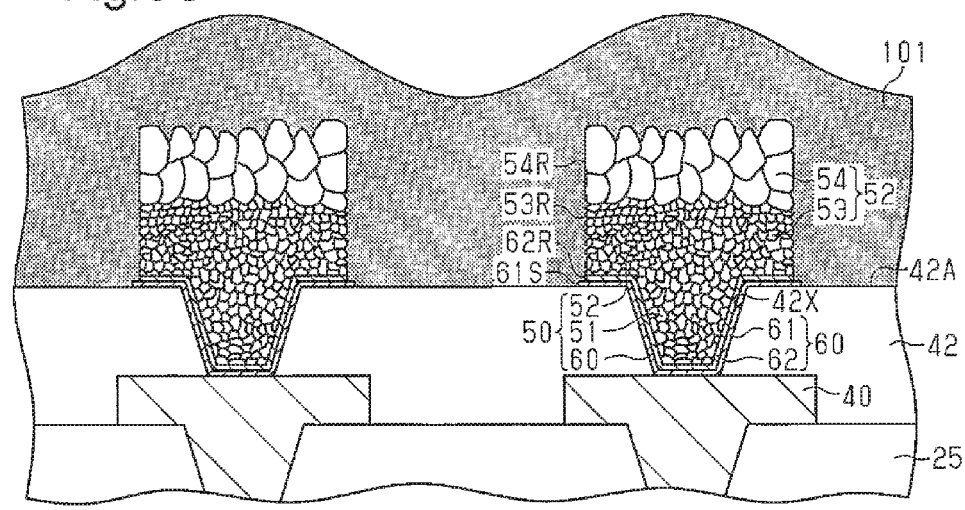

The photosensitive resin layer 101 is set to be thick enough to cover the entire connection terminals 52. When the thickness of each connection terminal 52 is, for example, 10 μm, the thickness of the photosensitive resin layer 101 is set to be approximately 10 μm on the upper surface 42A of the insulation layer 42. The photosensitive resin layer 101 is formed by following steps formed by the upper surface 42A of the insulation layer 42 and the connection terminals 52. Thus, the photosensitive resin layer 101 undulates so that the photosensitive resin layer 101 is located at a high position on the connection terminals 52 and at a low position between adjacent ones of the connection terminals 52. At this time, as illustrated in FIG. 6C, the photosensitive resin layer 101 is in contact with the rough surfaces 62R, 53R, 54R of the wiring layer 50 and covers the rough surfaces 62R, 53R, 54R. This improves the adhesiveness between the wiring layer 50 and the photosensitive resin layer 101 as compared to when the entire wiring layer 50 has a flat surface.

Figure 7A:
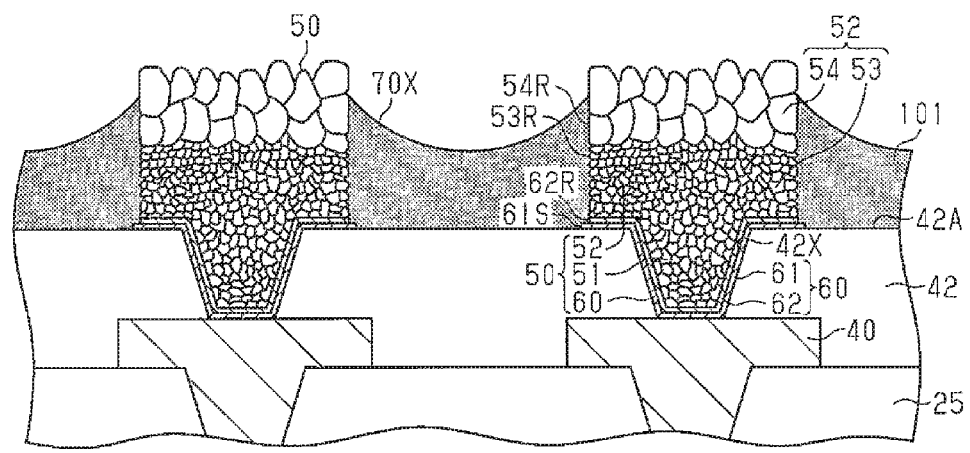

In the step of FIG. 7A, the entire surface of the photosensitive resin layer 101 is dissolved by a developer to reduce the photosensitive resin layer 101 in thickness. Consequently, the upper surface of each connection terminal 52 and a portion of the side surface of the connection terminal 52 are exposed from the photosensitive resin layer 101. The photosensitive resin layer 101 is thinned by the developer, for example, in a non-exposed state. The developer may be, for example, tetramethylammonium hydroxide (TMAH).

In a positive photosensitive resin layer, the developer normally melts exposed portions at a higher speed to form patterns. In this case, the developer also melts unexposed portions of the photosensitive resin layer even though the dissolving speed is very low. In the present embodiment, such a property of the positive photosensitive resin layer is used to control a removal amount of the photosensitive resin layer 101. This allows the photosensitive resin layer 101 to remain between the connection terminals 52 while the upper surfaces of the connection terminals 52 are exposed. At this time, as illustrated in FIG. 6C, the undulated upper surface of the photosensitive resin layer 101 is entirely thinned. This forms the recesses 70X in regions of the upper surface between the connection terminals 52. In this step, the photosensitive resin layer 101 is thinned to expose the upper surface and a portion of the side surface of the upper portion 54 of each connection terminal 52.

Then, the photosensitive resin layer 101 is cured through heating. Consequently, as illustrated in FIG. 7A, the protective insulation layer 70, which covers a portion of the side surface of each connection terminal 52 and includes the recesses 70X in the upper surface, is formed on the upper surface 42A of the insulation layer 42.

Figure 7B:
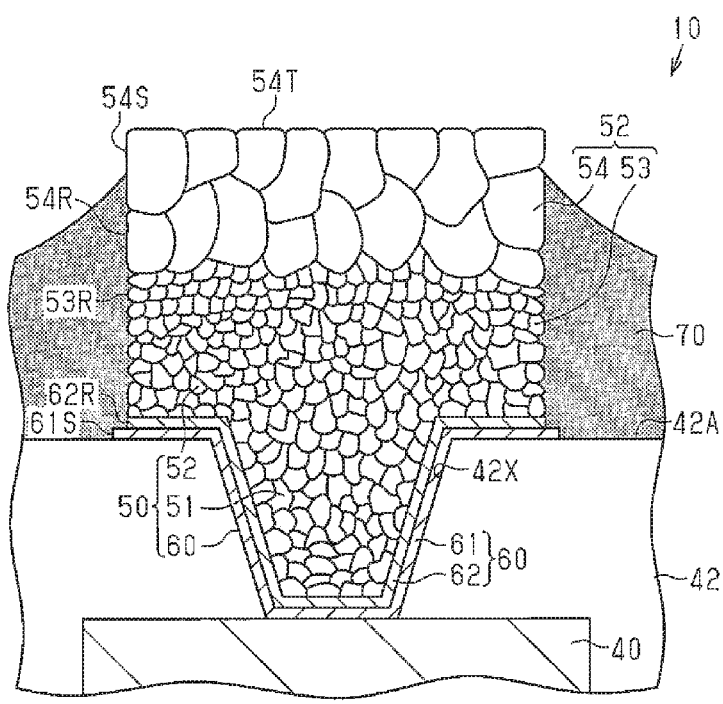

In the step of FIG. 7B, the surfaces (side surface and upper surface) of the upper portion 54 of the connection terminal 52 that is exposed from the protective insulation layer 70 is flattened. For example, etching (soft etching) in which the protective insulation layer 70 is used as an etching mask is performed from the upper surface of the connection terminal 52. This flattens the upper surface and the upper part of the side surface of the upper portion 54, which are exposed from the protective insulation layer 70, to form the smooth surface 54S and the smooth surface 54T. In the etching process, surfaces of Cu crystal grains located at the side surface and the upper surface of the upper portion 54 that are exposed from the protective insulation layer 70 are etched and thinned. This shallows grooves of grain boundaries between Cu crystal grains in the side surface and the upper surface of the upper portion 54 that are exposed from the protective insulation layer 70 compared to prior to the etching process. Consequently, the roughness degree of the side surface and the upper surface of the upper portion 54 that are exposed from the protective insulation layer 70 is decreased compared to prior to the etching process. In this manner, the etching process is performed so that the smooth surfaces 54S, 54T have a lower roughness degree than the lower part (i.e., rough surface 54R) of the side surface of the upper portion 54, which is covered by the protective insulation layer 70. In the present example, the etching process is performed so that the roughness degree of the smooth surfaces 54S, 54T has a surface roughness Rz value of approximately 500 to 1000 nm. The etchant used in this step may be, for example, an etchant including sulfuric acid and hydrogen peroxide as the main components. The above manufacturing steps manufacture the wiring substrate 10 illustrated in FIG. 1A.

A method for manufacturing the semiconductor device 80 will now be described with reference to FIGS. 8A to 9.

Figure 8A:
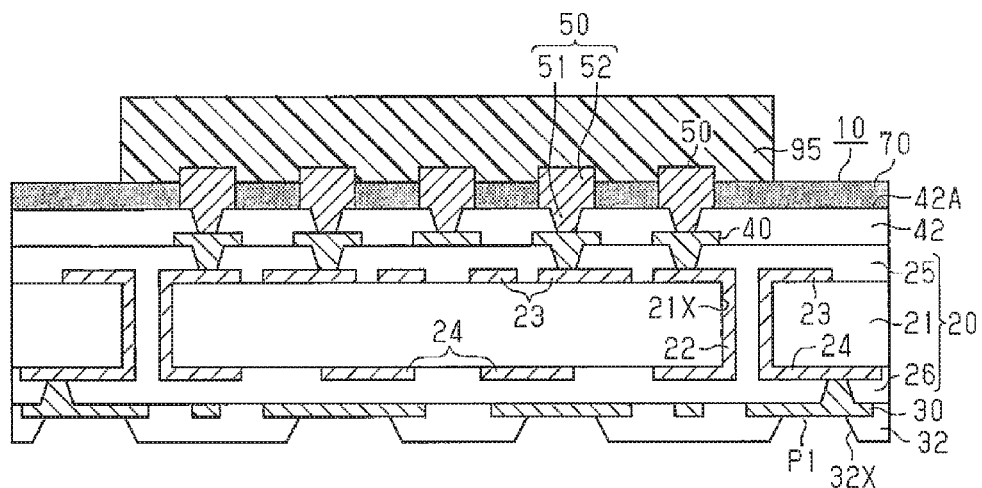
FIGS. 8A, 8B, and 9 are schematic cross-sectional diagrams illustrating a method for manufacturing the semiconductor device of FIG. 2A.
Figure 9:
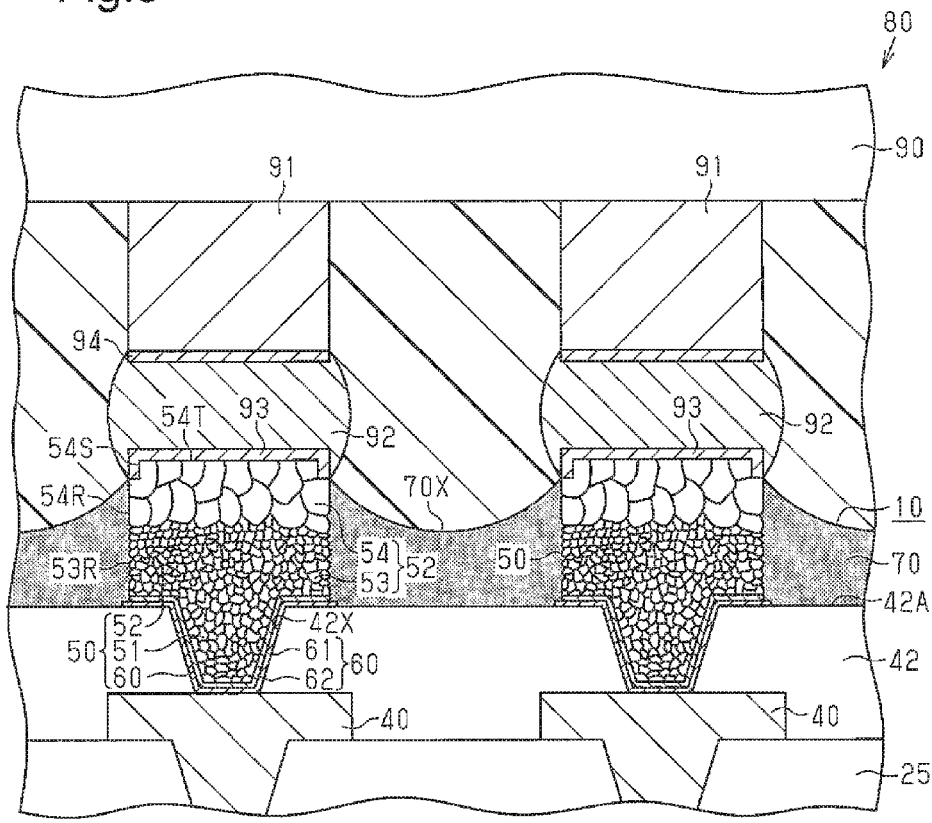

In the step of FIG. 8A, the B-stage (semi-cured) underfill resin 95 is formed on the upper surface of the protective insulation layer 70 to cover the connection terminals 52 that are exposed from the protective insulation layer 70. When a film of an insulative resin is used as the material of the underfill resin 95, the upper surface of the protective insulation layer 70 is laminated with the insulative resin film. In this step, the insulative resin film is not thermally cured and thus remains in the B-stage state. At this time, formation of voids in the underfill resin 95 may be limited by laminating with the underfill resin 95 in a vacuum atmosphere. When an insulative resin in a liquid or paste state is used as the material of the underfill resin 95, the liquid or paste of the insulative resin is applied to the upper surface of the protective insulation layer 70, for example, through printing or dispensing.

Figure 8B:
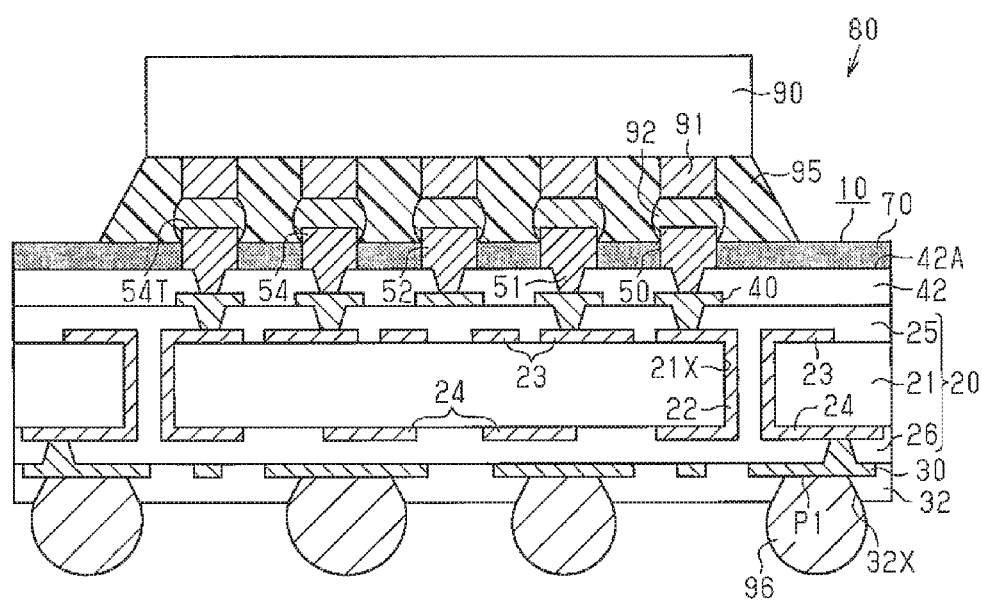

In the step of FIG. 8B, the semiconductor chip 90 including the columnar connection terminals 91 is prepared. The connection terminals 91 may be manufactured through a known manufacturing process. Although not be illustrated or described in detail, the connection terminals 91 may be manufactured, for example, through a process described below.

For example, a protective film, which includes openings that expose electrode pads, is formed on the circuit formation surface (here, lower surface) of the semiconductor chip 90. A seed layer is formed to cover a lower surface of the protective layer and lower surfaces of the electrode pads. A resist layer, which includes openings that expose the seed layer (seed layer covering lower surfaces of electrode pads)

at positions corresponding to formation regions of the connection terminals 91, is formed. Electrolytic plating (electrolyte copper plating) is performed using the seed layer exposed from the resist layer as a power feeding layer. This forms the columnar connection terminals 91 on the seed layer (electrode pads).

The solder layer 92 is formed on a lower surface of each connection terminal 91. Electrolyte solder plating is performed, for example, using the resist layer, which is formed on the seed layer, as a plating mask and the seed layer as a plating power feeding layer. This deposits a solder on the lower surfaces of the connection terminals 91 to form the solder layer 92. Then, unnecessary portions of the seed layer and the resist layer are removed.

The connection terminals 91 of the semiconductor chip 90 are flip-chip-bonded to the connection terminals 52 (wiring layer 50) of the wiring substrate 10. For example, the adhesiveness of the non-cured underfill resin 95 is used to temporarily fix the semiconductor chip 90 to the underfill resin 95, which is formed on the wiring substrate 10. The underfill resin 95 is heated, for example, at a temperature of approximately 190° C. to 300° C., and load is applied from a rear surface (here, upper surface) of the semiconductor chip 90. Consequently, the connection terminals 91 of the semiconductor chip 90 and the solder layer 92 penetrate the semi-cured underfill resin 95, and the solder layer 92 contacts the connection terminals 52. The solder layer 92 is melted and solidified through a reflow process to electrically connect the connection terminals 91, 52 to each other. In the reflow process, heating is performed, for example, at a temperature that is higher than the melting point of the solder layer 92. As illustrated in FIG. 9, the reflow process forms the alloy layer 93, which is formed from an alloy of Cu and Sn, at the interface between the upper portion 54 of the connection terminal 52 and the solder layer 92. In the present example, the upper portion 54, which is a Cu layer, is directly bonded to the solder layer 92. This increases the thickness of the alloy layer 93 as compared to, for example, when a surface-processed layer such as an Ni layer is formed on the surface of the upper portion 54. The alloy layer 93 has a higher resistance to electromigration than a simple solder (Sn). This improves the electromigration resistance of a portion that bonds the connection terminal 52 and the connection terminal 91 as compared to when a surface-processed layer is formed on the surface of the upper portion 54.

In this step, the underfill resin 95 is thermally cured through heating. Thus, the connection terminals 52, 91, the solder layer 92, and the like are covered by the thermally cured underfill resin 95.

If the surface of the upper portion 54 that is bonded to the solder layer 92 has the same roughness degree as the rough surface 53R, the resin and the filler of the underfill resin 95 easily enters the bonding portion of the solder layer 92 and the connection terminal 52. In other words, when the surface of the upper portion 54 is rough, the resin and the filler may enter between the solder layer 92 and the connection terminal 52. This may lower the reliability of the electrical connection between the solder layer 92 and the connection terminal 52.

In this regard, in the present example, as described above, the side surface and the upper surface of the upper portion 54 that are bonded to the solder layer 92 define the smooth surfaces 54S, 54T, which have a lower roughness degree than the rough surface 53R and the rough surface 54R. This limits entrance of the resin and the filler of the underfill resin 95 to the bonding portion of the solder layer 92 and the connection terminal 52. Thus, the reliability of the electrical connection is improved between the solder layer 92 and the connection terminal 52.

In the step of FIG. 8B, the external connection terminals 96 are formed on the external connection pads P1 of the wiring substrate 10. For example, after a flux is applied to the external connection pads P1, the external connection terminals 96 (here, solder balls) are mounted on the external connection pads P1. The reflow process is performed at a temperature of approximately 240° C. to 260° C. to fix the external connection terminals 96 to the external connection pads P1. The flux is removed through a surface cleaning process. The above manufacturing steps manufacture the semiconductor device 80 illustrated in FIG. 2A.

The present embodiment has the advantages described below.

(1) The protective insulation layer 70 is in contact with a portion of the side surface of each columnar connection terminal 52 and covers the portion of the side surface. This increases the interface between the connection terminal 52 and each of the insulation layer 42 and the protective insulation layer 70 and allows for dispersion of stress formed at the interface between the connection terminal 52 and each of the insulation layer 42 and the protective insulation layer 70. Consequently, formation of cracks is limited at the interface between the connection terminal 52 and each of the insulation layer 42 and the protective insulation layer 70.

(2) The side surface of each connection terminal 52 is rough at a position contacting the protective insulation layer 70. This produces an anchor effect and improves the adhesiveness between the connection terminal 52 and the protective insulation layer 70. Thus, separation of the protective insulation layer 70 from the insulation layer 42 is limited.

(3) The upper portion 54, which is located at a side of the connection terminal 52 that is bonded to the solder layer 92 has larger crystal grains than the lower portion 53, which is located at a side of the connection terminal 52 proximate to the wiring layer 40. This reduces the difference in the diffusion speeds between Cu and Sn and limits formation of Kirkendall voids at the interface between the connection terminal 52 (upper portion 54) and the solder layer 92.

(4) The lower portion 53 of the connection terminal 52 has a higher surface roughness degree than the upper portion 54. Thus, the lower portion 53 improves the adhesiveness between the connection terminal 52 and the protective insulation layer 70 while the upper portion 54 ensures flatness of the pad portion of the connection terminal 52.

(5) The side surface and the upper surface of the upper portion 54 that are exposed from the protective insulation layer 70 define the smooth surfaces 54S, 54T, which have a lower roughness degree than the side surface (rough surface 54R) of the upper portion 54 that is covered by the protective insulation layer 70. This limits entrance of the resin and the filler of the underfill resin 95 to the bonding portion of the solder layer 92 and the connection terminal 52. Thus, the reliability of the electrical connection is improved between the solder layer 92 and the connection terminal 52.

(6) The lower portion 53 and the upper portion 54, which have different crystal grain sizes, are formed by the same material (here, Cu). Thus, the interface between the lower portion 53 and the upper portion 54 does not include an alloy layer, which is formed when different metals are used. This enables the connection terminal 52 including the lower portion 53 and the upper portion 54 to have a strong structure. Further, the lower portion 53 and the upper portion 54 are formed, for example, by changing an electrolytic plating condition such as the current density. This reduces the manufacturing costs as compared to when the lower portion 53 and the upper portion 54 are formed from different materials. Additionally, use of copper, which has a low electrical resistance, as the material of the lower portion 53 and the upper portion 54 reduces the electrical resistance of the entire connection terminal 52.

(7) The direct bonding of the upper portion 54 of the connection terminal 52 and the solder layer 92 forms the Cu—Sn alloy layer 93 at the interface between the upper portion 54 and the solder layer 92. This improves the electromigration resistance in the bonding portion of the connection terminal 52 and the solder layer 92.

(8) The upper surface of the protective insulation layer 70 is recessed toward the insulation layer 42 defining the arcuate recesses 70X between adjacent ones of the connection terminals 52. The recesses 70X improve the fluidity of the underfill resin 95.

It should be apparent to those skilled in the art that the foregoing embodiments may be employed in many other specific forms without departing from the scope of this disclosure. Particularly, it should be understood that the foregoing embodiments may be employed in the following forms.

Figure 10:
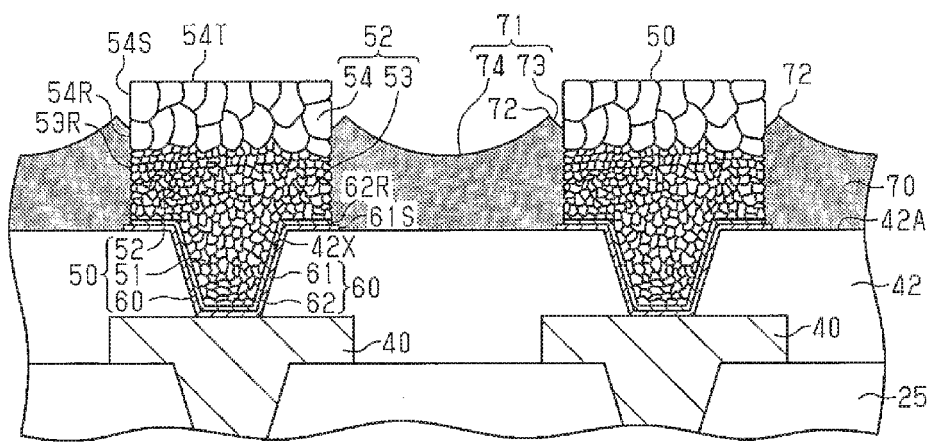
FIG. 10 is a partially enlarged cross-sectional view illustrating a modified example of a wiring substrate.

As illustrated in FIG. 10, the upper surface of the protective insulation layer 70 may include ridges 71 bulged toward the upper side. Each ridge 71 includes, for example, a peak 72 (upper end), which is sharp like a needle in a cross-sectional view. The ridge 71 also includes an inclined portion 73, which is inclined downward toward the connection terminal 52, and an inclined portion 74, which is inclined downward in a direction parting from the connection terminal 52. In this modified example, the inclined portion 73 is downwardly curved from the peak 72 toward the connection terminal 52. The inclined portion 74 is downwardly arcuate from the peak 72 in the direction parting away from the connection terminal 52 in a cross-sectional view. The ridge 71 (particularly, inclined portion 73) hinders the solder layer 92 (refer to FIG. 2A) from spreading outside the connection terminal 52.

The peak 72 does not necessarily have to be sharp like a needle in a cross-sectional view. The peak 72 may have, for example, a flat surface.

The recesses 70X may be omitted from the protective insulation layer 70. That is, the upper surface of the protective insulation layer 70 may be flat.

In the foregoing embodiment, the protective insulation layer 70 may cover the entire side surface of each connection terminal 52.

In the foregoing embodiment, the entire side surface of the upper portion 54 of each connection terminal 52 may be exposed from the protective insulation layer 70. In this case, the protective insulation layer 70 covers the entire side surface of the seed layer 60 and the entire side surface (or a portion of side surface) of the lower portion 53 of the connection terminal 52.

In the foregoing embodiment, the side surface and the upper surface of each connection terminal 52 that are exposed from the protective insulation layer 70 define the smooth surfaces 54S, 54T. Instead, the side surface and the upper surface of the connection terminal 52 that are exposed from the protective insulation layer 70 may be roughened at the same level as the rough surface 54R. Even in this case, the flatness of the pad portion of the connection terminal 52 is ensured by setting the roughness degree of the side surface and the upper surface of the connection terminal 52 that are exposed form the protective insulation layer 70 to be lower than the roughness degree of the rough surface 53R of the lower portion 53.

In the foregoing embodiment, the side surface of the metal film 61 may be rough.

In the foregoing embodiment, the side surface of the metal film 61 projects outward from the side surfaces of the connection terminal 52 and the metal film 62. Instead, the side surface of the metal film 61 may be flush with the side surfaces of the connection terminal 52 and the metal film 62. Alternatively, the side surface of the metal film 61 may be located inward from the side surfaces of the connection terminal 52 and the metal film 62.

Each connection terminal 52 of the foregoing embodiment may include an intermediate portion between the lower portion 53 and the upper portion 54. The intermediate portion has crystal grains that are larger than the crystal grains of the lower portion 53 and smaller than the crystal grains of the upper portion 54.

In the foregoing embodiment, after the underfill resin 95 is formed on the upper surface of the protective insulation layer 70, the semiconductor chip 90 is flip-chip-mounted on the wiring substrate 10. Instead, for example, after the semiconductor chip 90 is flip-chip-mounted on the wiring substrate 10, the gap between the wiring substrate 10 and the semiconductor chip 90 may be filled with the underfill resin 95.

A plasma processing may be performed on the upper surface of the protective insulation layer 70 of the foregoing embodiment. This improves the wettability of the protective insulation layer 70.

In the foregoing embodiment, in the steps of FIGS. 7A and 7B, a surface-processed layer may be formed on the upper surface and the side surface of each connection terminal 52 that are exposed from the protective insulation layer 70. Examples of the surface-processed layer include an Au layer, an Ni layer/Au layer, and an Ni layer/Pd layer/Au layer. Also, the surface-processed layer may be formed through an anti-oxidization process such as an OSP process.

Instead of the semiconductor chip 90, a chip component such as a chip capacitor, a chip resistor, or a chip inductor may be mounted on the wiring substrate 10 of the foregoing embodiment. Also, an electronic component other than the semiconductor chip 90 such as a quartz crystal unit may be mounted.

In the wiring substrate 10 of the foregoing embodiment, the structure at the inner side of the wiring layers 30, 40, that is, the structure of the substrate body 20, is not particularly limited. The substrate body 20 only needs to be configured to at least electrically connect the wiring layers 30, 40 to each other. Thus, the structure at the inner side of the wiring layers 30, 40 is not particularly limited. For example, the structure and the material of the core substrate 21 are not particularly limited. The number of layers of lower layer wirings (e.g., wiring patterns 23, 24) formed on the core substrate 21 is not particularly limited. Also, the number of insulation layers (e.g., insulation layers 25, 26) that cover the lower layer wirings is not particularly limited. Further, the substrate body 20 may be a coreless substrate that does not include the core substrate 21 instead of a build-up core substrate including the core substrate 21.

Clauses

This disclosure further encompasses the following embodiments.

1. A method for manufacturing a wiring substrate, the method including:
   forming a wiring layer;

forming an insulation layer that covers the wiring layer;
forming a via hole that extends through the insulation layer in a thickness-wise direction and exposes an upper surface of the wiring layer;
forming a via wiring in the via hole;
forming a columnar first connection terminal electrically connected to the wiring layer by the via wiring, wherein the first connection terminal projects upward from an upper surface of the insulation layer;
roughening an upper surface and a side surface of the first connection terminal; and
forming a protective insulation layer on the upper surface of the insulation layer, wherein the protective insulation layer covers the side surface of the first connection terminal, wherein
the forming a first connection terminal includes
  forming a lower portion of the first connection terminal through electrolytic plating with a current density set to a first value, and
  forming an upper portion of the first connection terminal through electrolytic plating with the current density set to a second value that is smaller than the first value, wherein the first connection terminal is formed so that the upper portion is larger in crystal grain size than the lower portion by setting the current density to the second value smaller than the first value, and
the roughening an upper surface and a side surface of the first connection terminal includes performing roughening so that the lower portion has a higher surface roughness degree than the upper portion.

2. The method according to clause 1, wherein
the forming a protective insulation layer includes forming the protective insulation layer that covers an entire side surface of the lower portion and a lower part of a side surface of the upper portion, and
the method further includes after forming the protective insulation layer, smoothing an upper surface of the upper portion and an upper part of the side surface of the upper portion that are exposed from the protective insulation layer.

3. The method according to clause 1 or 2, wherein the forming a protective insulation layer includes
forming a photosensitive resin layer that entirely covers both of the side surface and the upper surface of the first connection terminal by applying a positive photosensitive resin to the upper surface of the insulation layer, and
forming the protective insulation layer by dissolving and thinning the photosensitive resin layer in a non-exposed state with a developer.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to an illustration of the superiority and inferiority of the invention. Although embodiments have been described in detail, it should be understood that various changes, substitutions, and alterations could be made hereto without departing from the scope of this disclosure.

The invention claimed is:

1. A wiring substrate comprising:
a wiring layer;
an insulation layer that covers the wiring layer;
a via hole that extends through the insulation layer in a thickness-wise direction and exposes an upper surface of the wiring layer;
a via wiring formed in the via hole;
a columnar first connection terminal electrically connected to the wiring layer by the via wiring and adapted to be connected to an electronic component, wherein the first connection terminal projects upward from an upper surface of the insulation layer; and
a protective insulation layer formed on the upper surface of the insulation layer, wherein the protective insulation layer is in contact with and covers a portion of a side surface of the first connection terminal, wherein
the first connection terminal includes a lower portion that is continuous with the via wiring and an upper portion that is continuous with the lower portion,
the lower portion is set to be smaller in crystal grain size than the upper portion,
the lower portion and the upper portion are formed from the same metal material,
a side surface of the lower portion is set to have a higher roughness degree than a side surface of the upper portion,
the protective insulation layer is thinner than the first connection terminal,
the side surface of the upper portion of the first connection terminal includes a lower part covered by the protective insulation layer and an upper part exposed from the protective insulation layer,
the protective insulation layer covers the entire side surface of the lower portion and the lower part of the side surface of the upper portion, and
the upper part of the side surface of the upper portion is set to have a lower surface roughness degree than the lower part of the side surface of the upper portion.

2. The wiring substrate according to claim 1, wherein
the upper portion includes a surface exposed from the protective insulation layer, and
the surface of the upper portion exposed from the protective insulation layer defines an outermost surface of the wiring substrate.

3. The wiring substrate according to claim 1, further comprising
a seed layer, wherein the seed layer continuously covers the upper surface of the wiring layer exposed in the via hole, an inner surface of the insulation layer defining the via hole, and the upper surface of the insulation layer, wherein
the via hole is filled with the via wiring formed on the seed layer, and
the first connection terminal is located on an upper surface of the via wiring and an upper surface of the seed layer.

4. The wiring substrate according to claim 1, wherein the first connection terminal is one of a plurality of first connection terminals, the wiring substrate further comprising
a recess located on an upper surface of the protective insulation layer between adjacent ones of the first connection terminals and recessed in an arcuate manner toward the insulation layer.

5. The wiring substrate according to claim 1, wherein the lower portion is thicker than the upper portion.

6. A semiconductor device comprising:
the wiring substrate according to claim 1;
a solder layer located on the first connection terminal;
a second connection terminal bonded to the first connection terminal by the solder layer; and an electronic component that includes a circuit formation surface on which the second connection terminal is arranged, wherein the electronic component is electrically connected to the first connection terminal by the second connection terminal and the solder layer, wherein the upper portion of the first connection terminal includes a surface exposed from the protective insulation layer and directly bonded to the solder layer.

7. The semiconductor device according to claim 6, wherein the solder layer is formed from a solder containing tin, the first connection terminal is formed from copper or an copper alloy, and the first connection terminal is directly bonded to the solder layer to form an alloy layer of copper and tin at an interface between the first connection terminal and the solder layer.

8. The semiconductor device according to claim 6, wherein the solder layer is formed on an entire upper surface of the upper portion and an upper part of the side surface of the upper portion.

* * * * *